(12) United States Patent
Komuta

(10) Patent No.: US 9,449,949 B2
(45) Date of Patent: Sep. 20, 2016

(54) METHOD FOR MANUFACTURING SEMICONDUCTOR DEVICE AND SEMICONDUCTOR DEVICE

(71) Applicant: KABUSHIKI KAISHA TOSHIBA, Tokyo (JP)

(72) Inventor: Naoyuki Komuta, Oita Oita (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 49 days.

(21) Appl. No.: 14/475,315

(22) Filed: Sep. 2, 2014

(65) Prior Publication Data

US 2015/0262847 A1 Sep. 17, 2015

(30) Foreign Application Priority Data

Mar. 14, 2014 (JP) ................................ 2014-052125

(51) Int. Cl.
*H01L 21/77* (2006.01)
*H01L 25/065* (2006.01)
(Continued)

(52) U.S. Cl.
CPC ......... *H01L 25/0657* (2013.01); *H01L 21/561* (2013.01); *H01L 21/76898* (2013.01); *H01L 21/78* (2013.01); *H01L 23/5384* (2013.01); *H01L 24/17* (2013.01); *H01L 24/81* (2013.01); *H01L 24/97* (2013.01); *H01L 25/50* (2013.01); *H01L 23/3128* (2013.01); *H01L 24/05* (2013.01); *H01L 24/06* (2013.01); *H01L 24/13* (2013.01); *H01L 24/16* (2013.01); *H01L 24/32* (2013.01); *H01L 24/73* (2013.01); *H01L 24/92* (2013.01); *H01L 2224/0401* (2013.01); *H01L 2224/05009* (2013.01); *H01L 2224/05548* (2013.01); *H01L 2224/06135* (2013.01); *H01L 2224/06136* (2013.01); *H01L 2224/131* (2013.01); *H01L 2224/13025* (2013.01); *H01L 2224/16146* (2013.01); *H01L 2224/16225* (2013.01); *H01L 2224/1703* (2013.01); (Continued)

(58) Field of Classification Search
CPC ... H01L 21/77; H01L 21/78; H01L 21/8221; H01L 21/82; H01L 25/043; H01L 25/0657
See application file for complete search history.

(56) References Cited

U.S. PATENT DOCUMENTS 8,921,221 B2 * 12/2014 McLeod .................. B23K 1/20
257/E21.508
2010/0258933 A1 10/2010 Fujishima et al.
2010/0261311 A1 10/2010 Tsuji

OTHER PUBLICATIONS

Taiwan Office Action dated Dec. 8, 2015, filed in Taiwan counterpart Patent Application No. 103125585, 8 pages (with English translation).

*Primary Examiner* — Ha Tran T Nguyen
*Assistant Examiner* — Suberr Chi
(74) *Attorney, Agent, or Firm* — Patterson & Sheridan, LLP

(57) ABSTRACT

A first semiconductor chip has a first electrode pad, and a second semiconductor chip has a first through via and a second electrode pad joined to the via and aligned with the first electrode pad. A third semiconductor chip has a second through via, a third electrode pad joined to the via, wiring joined to the via, and a fourth electrode pad joined to the wiring and aligned with the second and third electrode pads. The semiconductor chips are stacked and electrically connected by joining the first to third electrode pads to one another, and gaps of the stacked body are filled with resin. The stacked body is secured to an adhesive material formed on a substrate and a solder bump formed on the substrate is joined to the fourth electrode. A molding resin encapsulates the stacked body and an adjacent surface of the substrate.

13 Claims, 15 Drawing Sheets

(51) Int. Cl.
  *H01L 21/768* (2006.01)
  *H01L 21/78* (2006.01)
  *H01L 23/00* (2006.01)
  *H01L 23/538* (2006.01)
  *H01L 25/00* (2006.01)
  *H01L 21/56* (2006.01)
  *H01L 23/31* (2006.01)
(52) U.S. Cl.
  CPC ............ *H01L 2224/1713* (2013.01); *H01L 2224/17181* (2013.01); *H01L 2224/2731* (2013.01); *H01L 2224/32145* (2013.01); *H01L 2224/32245* (2013.01); *H01L 2224/73204* (2013.01); *H01L 2224/73253* (2013.01); *H01L 2224/81191* (2013.01); *H01L 2224/81192* (2013.01); *H01L 2224/81203* (2013.01); *H01L 2224/81205* (2013.01); *H01L 2224/92125* (2013.01); *H01L 2224/92242* (2013.01); *H01L 2224/97* (2013.01); *H01L 2225/06513* (2013.01); *H01L 2225/06517* (2013.01); *H01L 2225/06541* (2013.01); *H01L 2225/06565* (2013.01); *H01L 2225/06589* (2013.01); *H01L 2225/06593* (2013.01); *H01L 2924/10253* (2013.01); *H01L 2924/15311* (2013.01); *H01L 2924/181* (2013.01); *H01L 2924/3512* (2013.01)

METHOD FOR MANUFACTURING SEMICONDUCTOR DEVICE AND SEMICONDUCTOR DEVICE

CROSS-REFERENCE TO RELATED APPLICATION

This application is based upon and claims the benefit of priority from Japanese Patent Application No. 2014-052125, filed Mar. 14, 2014, the entire contents of which are incorporated herein by reference.

FIELD

Embodiments described herein relate generally to a method for manufacturing a semiconductor device in which a stacked body having a plurality of semiconductor chips is connected to a substrate, and to such a semiconductor device.

BACKGROUND

As a semiconductor device, there is a semiconductor device in which a stacked body formed of two or more semiconductor chips are stacked on a substrate (chip-on-chip type). In the semiconductor chip located in the stacked body, a through via called a through silicon via (TSV), for example, is formed, and a metal electrode joined to the through via is provided. Then, as a result of the metal electrodes of the semiconductor chips being joined to one another, the chips are electrically connected to one another. In the uppermost of the plurality of the stacked semiconductor chips, a rewiring film (e.g., RDL: Re-Distribution Layer) connected to the electrode is formed along with a protective film.

On the substrate, a plurality of solder bumps are formed, and each solder bump and the electrodes in the rewiring film located on the uppermost semiconductor chip are brought together by turning the stacked body upside down to enable a flip-chip type connection, and resin molding is performed on the joined structure, whereby a semiconductor device is completed.

DETAILED DESCRIPTION

Figure 1A:
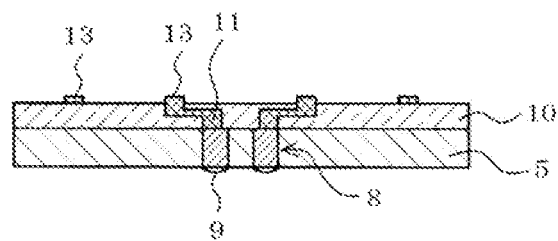
FIGS. 1A to 1D depict a first embodiment and collectively depict an exploded sectional view of a stacked body configured with semiconductor chips and a metal substrate.
Figure 1B:
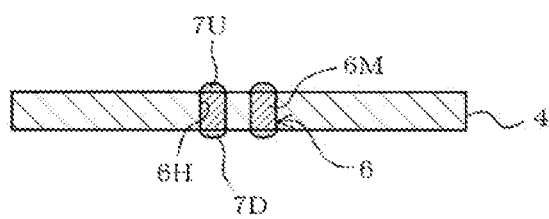
Figure 1C:
Figure 1D:
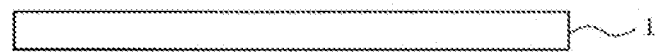
Figure 2A:
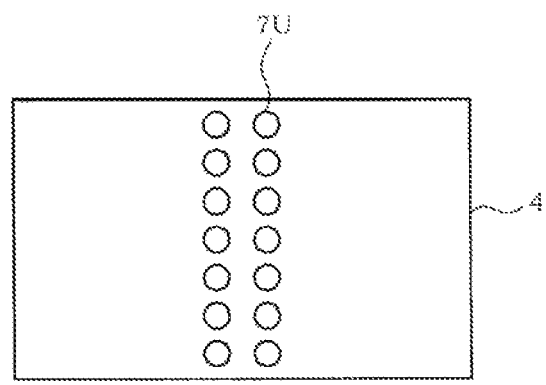
FIGS. 2A and 2B depict the first embodiment, FIG. 2A being a plan view of an intermediate semiconductor chip and FIG. 2B being a bottom view of the intermediate semiconductor chip.
Figure 2B:
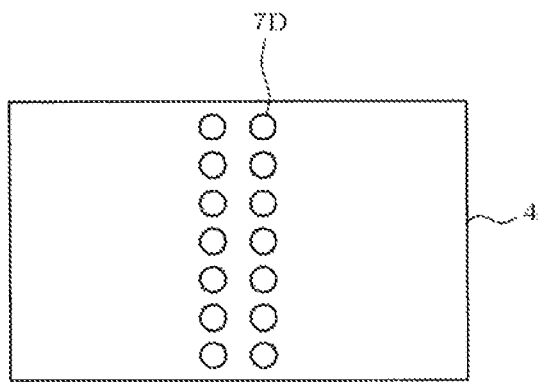
Figure 3A:
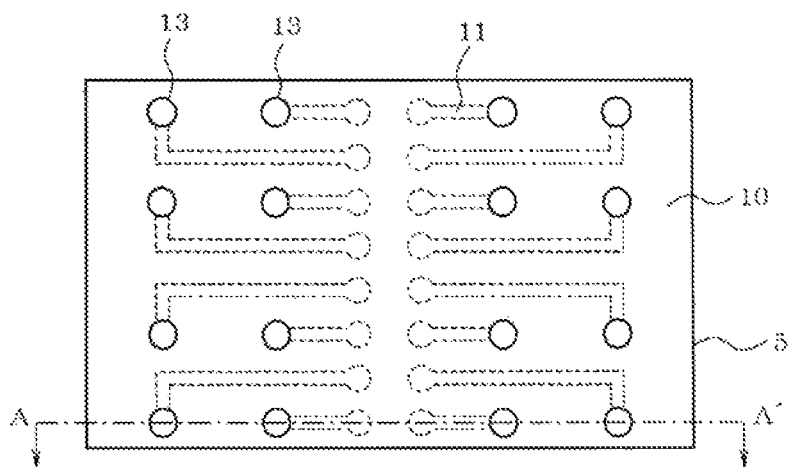
FIGS. 3A and 3B depict the first embodiment, FIG. 3A being a plan view of an uppermost semiconductor chip and FIG. 3B being a bottom view of the uppermost semiconductor chip.
Figure 3B:
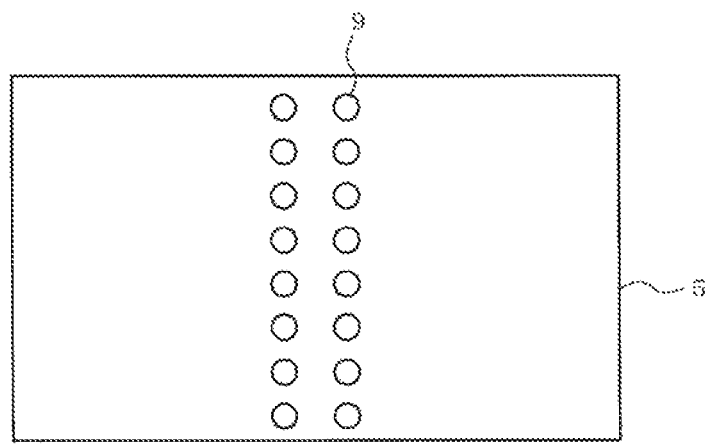

A substrate is generally thin and has a thickness of a hundred and several tens of micrometers or less, and, if the substrate becomes deformed or warped due to thermal contraction occurring during the connection of the stacked body to the substrate by heating solder bumps to a flow temperature and then cooling the joined stacked body-substrate structure, a crack may appear in a solder joint and breaks in the solder joint connection may occur.

Embodiments provide a method for manufacturing a semiconductor device that may suppress cracks from appearing in a solder joint, and the resulting semiconductor device.

In general, according to one embodiment, in a method for manufacturing a semiconductor device, at least one second semiconductor chip having a first through via and a second electrode pad joined to the first through via is mounted on a first semiconductor chip having a first electrode pad with the first electrode pad and the second electrode pad being brought into alignment with each other. Next, a third semiconductor chip with a second through via, the third semiconductor chip having, on one surface thereof, a third electrode pad joined to the second through via and, on the other surface, wiring formed within a protective film joined to the second through via and a fourth electrode pad connected to the wiring and exposed through openings in the film, is mounted on the second semiconductor chip with the second electrode pad and the third electrode pad being brought into alignment with each other.

Then, by joining the first to third electrode pads to one another, the first semiconductor chip, the second semiconductor chip, and the third semiconductor chip are electrically connected to one another, and gaps in the stacked body occurring between the first semiconductor chip, the second semiconductor chip, and the third semiconductor chip are filled with resin.

Then, in order to mount a plurality of such stacked bodies with the surface of a substrate on which solder bumps are formed, and an adhesive material is located adjacent to the solder bumps, and each solder bump in a region of solder bumps on the substrate and each contact of the fourth electrode pad of each stacked body are joined to each other while being brought into alignment with each other and the plurality of stacked bodies are secured to the substrate with the adhesive material. Finally, after the stacked bodies and the one surface of the substrate are encapsulated with molding resin, package dicing is performed to obtain separate stacked bodies.

(First Embodiment)

Hereinafter, a first embodiment will be described with reference to FIGS. 1A to 13. As depicted in FIGS. 1A to 1D and 4, on a metal substrate 1, a lowermost semiconductor chip (for example, a silicon chip) 2 is mounted. On an upper surface side of the semiconductor chip 2, the chip 2 having a rectangular shape measuring about several to over ten millimeters square for example, an element or a circuit (for example, a memory cell and peripheral circuits thereof) is formed (not depicted in the drawing), and, to connect the element or the circuit electrically to an element or a circuit which is formed on another chip, a metal electrode pad 3 is formed in a central portion of the chip and connects to the element or circuit therein.

A semiconductor chip 4 (in FIGS. 1A to 1D, only one semiconductor chip 4 is depicted) is located to be placed between the semiconductor chip 2 and an uppermost semiconductor chip 5. In the semiconductor chip 4, a through via 6 is formed in a central portion thereof so that the position of the through via 6 corresponds to a position in which the metal electrode pad 3 of the semiconductor chip 2 is formed. The through via 6 comprises a via hole 6H and a filling material 6M (for example, copper) filling the via hole 6H with an insulating film (not depicted in the drawing) interposed between the filling material 6M and the via hole 6H. On an upper surface side and a lower surface side of the semiconductor chip 4, metal electrode pads 7U and 7D joined to the through via 6 are formed, respectively (see FIGS. 2A and 2B), each pad 7U and 7D comprising a plurality of individual electrodes.

Also in the uppermost semiconductor chip 5, a through via 8 is formed in the same manner as in the semiconductor chip 4. Then, on a lower surface of the semiconductor chip 5, a metal electrode pad 9 joined to the through via 8 is formed, and, on an upper surface thereof, a rewiring section 11 (uppermost-layer wiring) within a protective film 10 is located to be joined to the through via 8. Rewiring section 11 comprises a conductive trace encased within the protective film 10, the conductive traces terminating at one end thereof in a plurality of pads which are exposed through openings in the protective film 10, and are arranged in the pattern of the electrodes of the metal pads on the substrates, and at another end thereof, further from the center of the protective film 10 than the first end, metal electrode pads 13 exposed through openings in the protective film 10. The rewiring portion 11 distributes the electrical connection of the pads on the underside of protective film and in contact with a substrate to pads which are spaced further apart than the electrodes of the substrate pads. Thus metal electrode pads 13 are formed in the rewiring section 11 (see FIGS. 3A and 3B) to establish electrical connection with a substrate 12, as will be described later. Here, the cross section depicted in FIGS. 1A to 1D and other drawings is a cross section taken on the line A-A' of FIG. 3A. Moreover, the thicknesses of the semiconductor chips 2, 4, and 5 are about 30 to 50 μm, for example.

Figure 4:
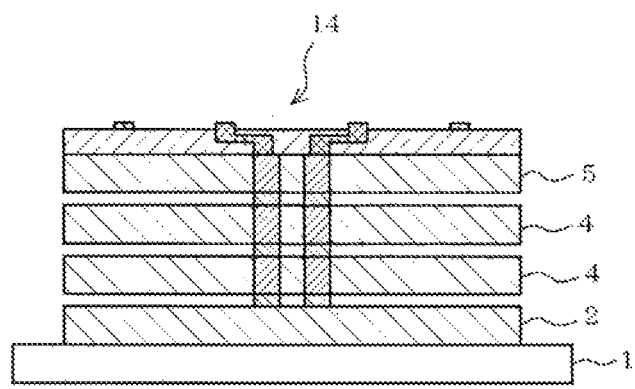
FIG. 4 depicts the first embodiment and is a sectional view of a state in which the semiconductor chips and the metal substrate are stacked.
Figure 5:
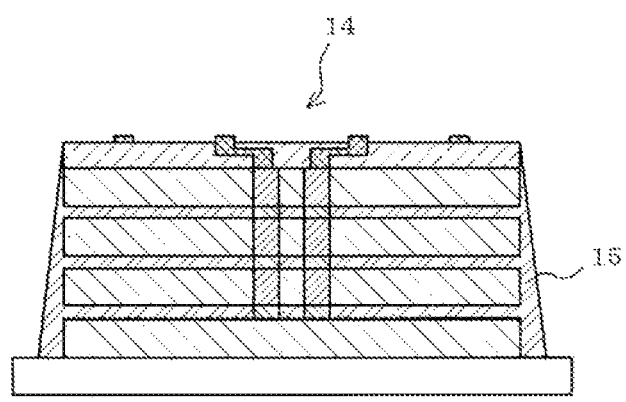
FIG. 5 depicts the first embodiment and is a sectional view of a stacked body formed by filling the gaps between the semiconductor chips with UF resin.

FIG. 4 depicts a state in which the metal substrate 1, the lowermost semiconductor chip 2, two intermediate semiconductor chips 4, and the uppermost semiconductor chip 5 are joined to one another, that is, a stacked body 14 is formed. The lowermost semiconductor chip 2 is bonded to the metal substrate 1 with an adhesive material such as a die-attach-film. The semiconductor chips 2, 4, and 5 are mounted with the positions of the metal electrode pads 3, 7, and 9 thereof being brought into alignment with each other, and the metal electrode pads 3, 7, and 9 are joined to one another by thermocompression bonding. Then, as depicted in FIG. 5, the gaps between the semiconductor chips 2, 4, and 5 are filled with UF resin 15.

Figure 6:
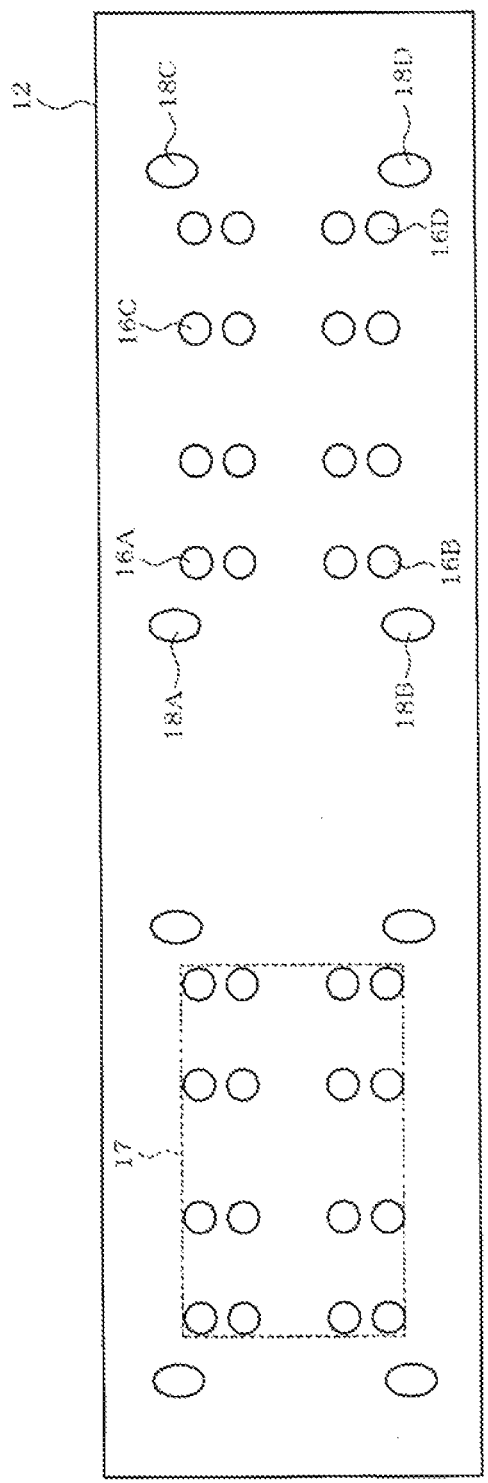
FIG. 6 depicts the first embodiment and is a plan view of a state in which an adhesive material is mounted on the substrate along with solder bumps.

As depicted in FIG. 6, on the substrate 12 where the stacked body 14 is not yet mounted, solder bumps 16 are placed in positions, each coinciding with a position in which the metal electrode pad 13 of the semiconductor chip 5 is formed. For example, sixteen solder bumps 16 are placed for one stacked body 14, and a placement region 17 in which the sixteen solder bumps 16 are placed is formed such that the outside shape (perimeter) of the location of the sixteen solder bumps 16 is rectangular. Moreover, on the substrate 12, in order to mount a plurality of (in this example, two) stacked bodies 14 thereon, two placement regions 17 in which the solder bumps 16 are placed are provided.

Figure 7:
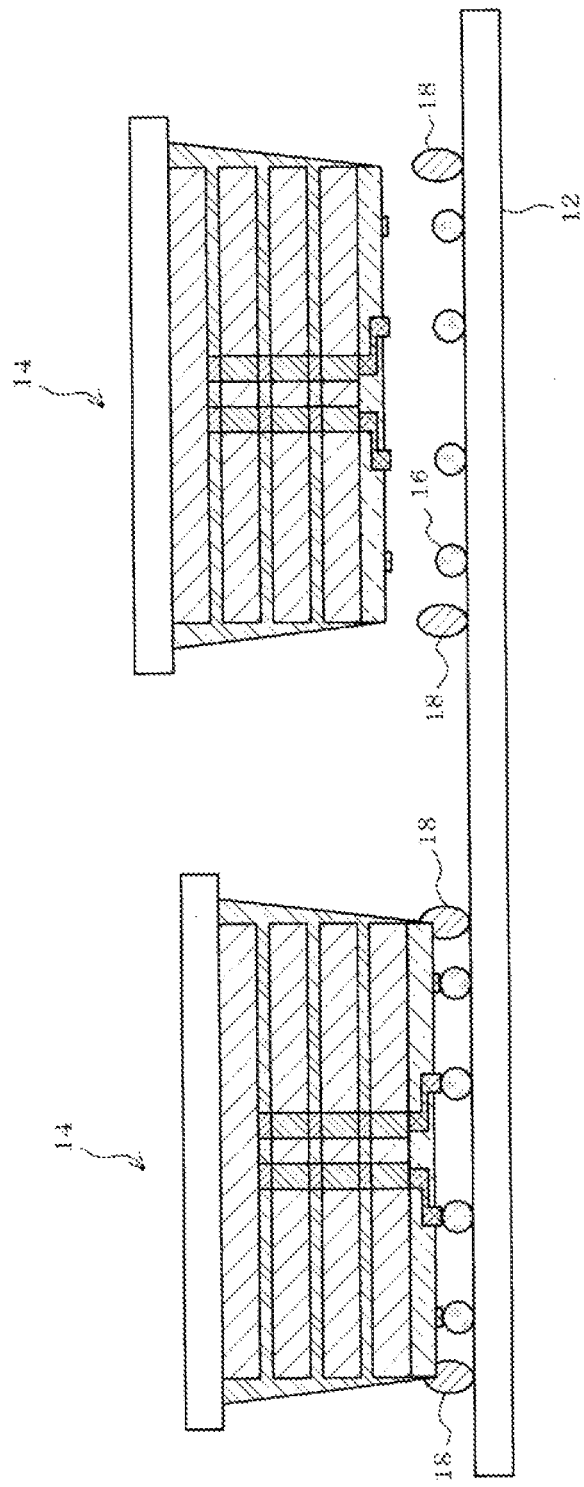
FIG. 7 depicts the first embodiment and is a sectional view of a state in which the stacked body is soldered to the substrate and the four corners are fixed with the adhesive material.

In addition, in this embodiment, along with the solder bumps 16, an adhesive material 18 is placed on the substrate 12. As for the adhesive material 18, if the outside shape of the sixteen solder bumps 16 on the substrate is rectangular as described above, adhesive materials 18A to 18D are respectively placed in positions near the outer sides of solder bumps 16A to 16D corresponding to the four corners of the perimeter of the placement region 17. In other words, the adhesive materials 18A to 18D are placed on extensions of diagonal lines intersecting the corners of the rectangular perimeter of the placement region. Moreover, as depicted in FIG. 7, the adhesive materials 18A to 18D are thus located to be in contact with the four corners of the rewiring section 11 on the semiconductor chip 5 of the stacked body 14 when the stacked body 14 is mounted on the substrate 12, such that a small gap may occur between the stacked body and the substrate 12 in the region between the adhesive locations, so that the substrate 12 may bend into the space between adjacent solder bump 16 locations. Additionally, in the region between the adhesive locations, even if the stacked body contacts the substrate 12, the substrate and stacked body can move slightly with respect to each other.

A right side of FIG. 7 depicts a state immediately before the stacked body 14 is mounted on (joined to) the substrate 12, and a left side of FIG. 7 depicts a state immediately after the stacked body 14 is mounted on the substrate 12. At this time, two stacked bodies 14 are being mounted to the substrate 12, in a state in which the two stacked bodies 14 are turned upside down, so that the position of the metal electrode pads 13 of the rewiring section 11 on each semiconductor chip 5 coincides with the position in which a corresponding solder bump 16 is formed on the substrate 12, thermocompression bonding is performed by applying a load in a high-temperature state, for example, and a soldered joint between the metal electrode pas 13 and solder bumps 16 is thus made. Incidentally, heating may be performed with ultrasound or the like, if necessary.

The adhesive material 18 is heated when the stacked bodies 14 are being soldered to the substrate 12, and solidifies as a result of undergoing subsequent cooling, thereby fixing the position of the four corners of each stacked body 14 on the substrate 12. As a result, even when the substrate 12 is about to shrink, and thus deform, as a result of thermal contraction or the like, the deformation is prevented because the four corners of each stacked body 14 are fixed to the substrate 12 with the adhesive material 18 and the stress otherwise imposed on the solder joints is taken up at the adhesive to substrate 12 and adhesive to stacked body 14 joints, whereby the occurrence of a crack in a solder joint is suppressed.

Figure 8:
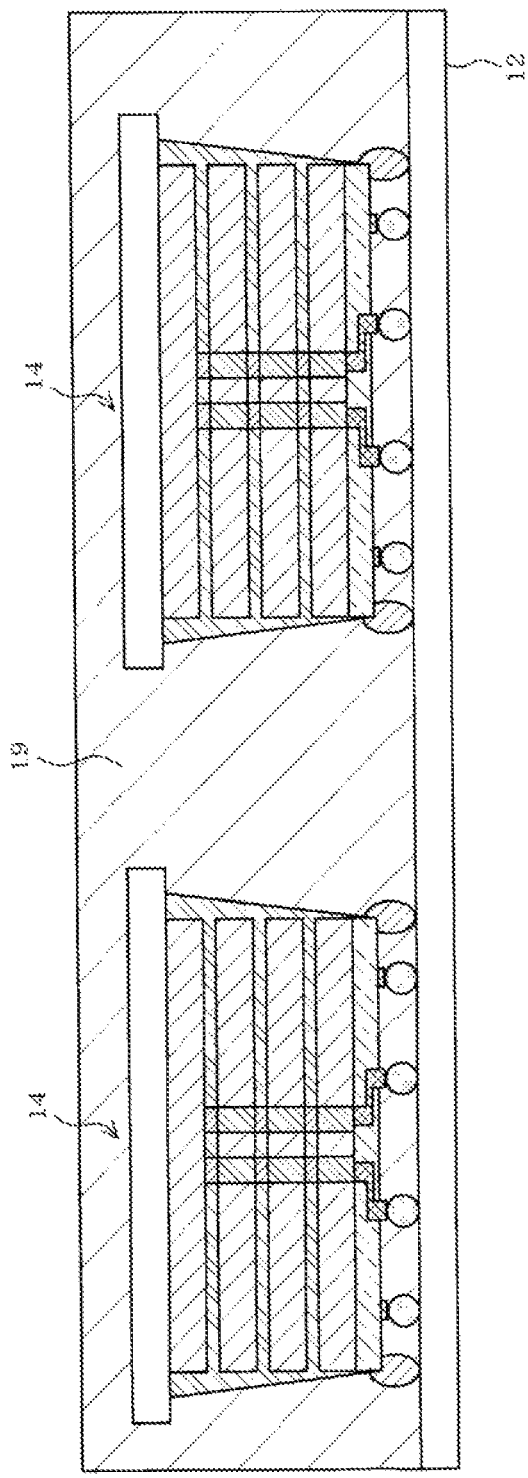
FIG. 8 depicts the first embodiment and is a sectional view of a state in which the stacked bodies on the substrate are encapsulated in molding resin.
Figure 9:
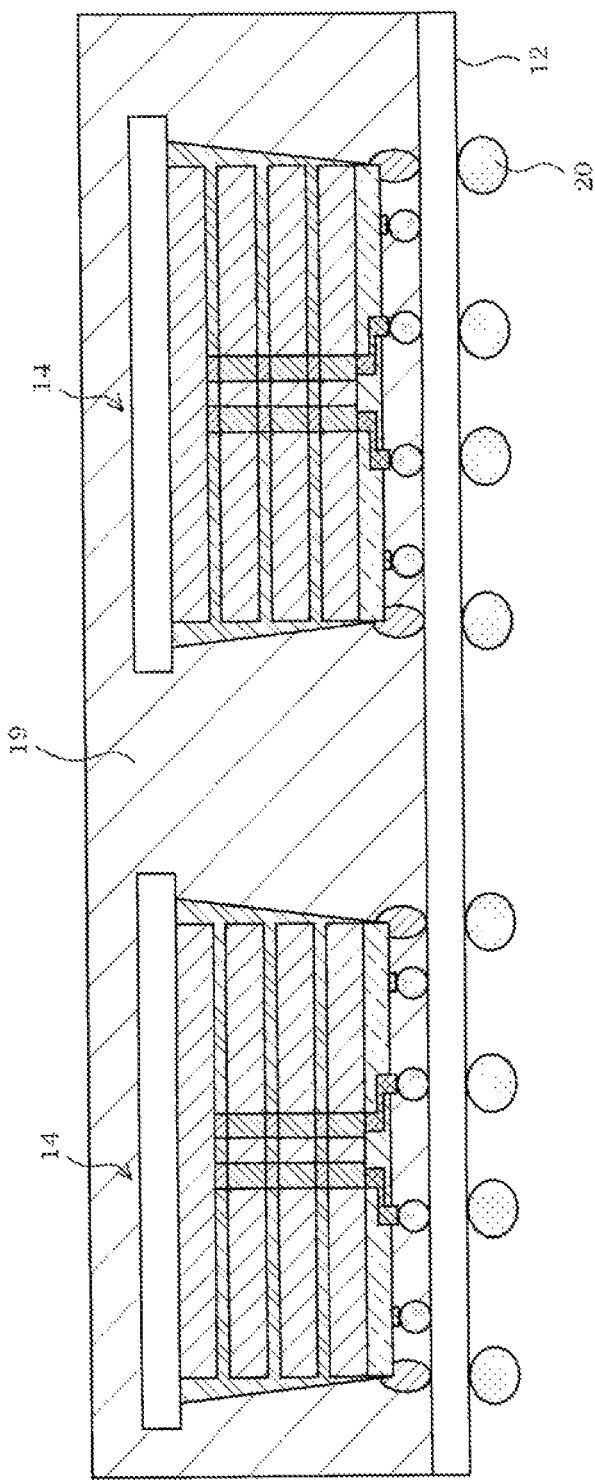
FIG. 9 depicts the first embodiment and is a sectional view of a state in which solder balls are joined to a lower surface of the substrate.
Figure 10:
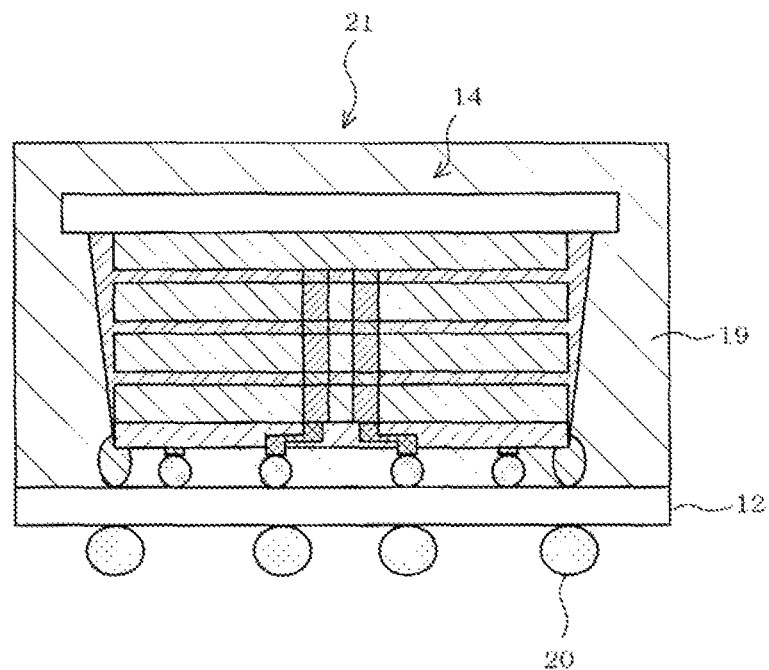
FIG. 10 depicts the first embodiment and is a sectional view of a state of each semiconductor device obtained by package dicing.

Then, as depicted in FIG. 8, the stacked bodies 14 mounted on the substrate 12 are encapsulated in molding resin 19. Then, as depicted in FIG. 9, solder balls 20 are joined to the positions of electrode pads (not depicted in the drawing) placed on the lower surface side of the substrate 12. Package dicing is then performed in this state to obtain separate portions, each containing a corresponding one of the stacked bodies 14, as depicted in FIG. 10. In this way, as a separate item, a semiconductor device 21 (a semiconductor device) in a ball grid array (BGA) package is completed.

Figure 11A:
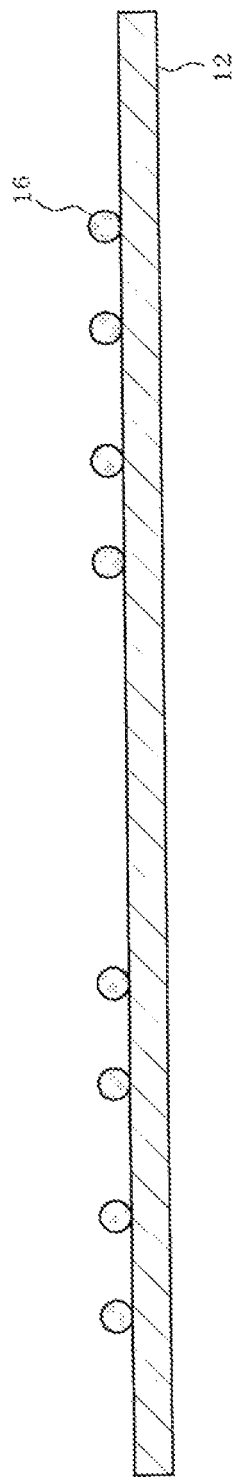
FIG. 11A is a sectional view of a state in which only the solder bumps are mounted on the substrate and FIG. 11B is a plan view thereof.
Figure 11B:
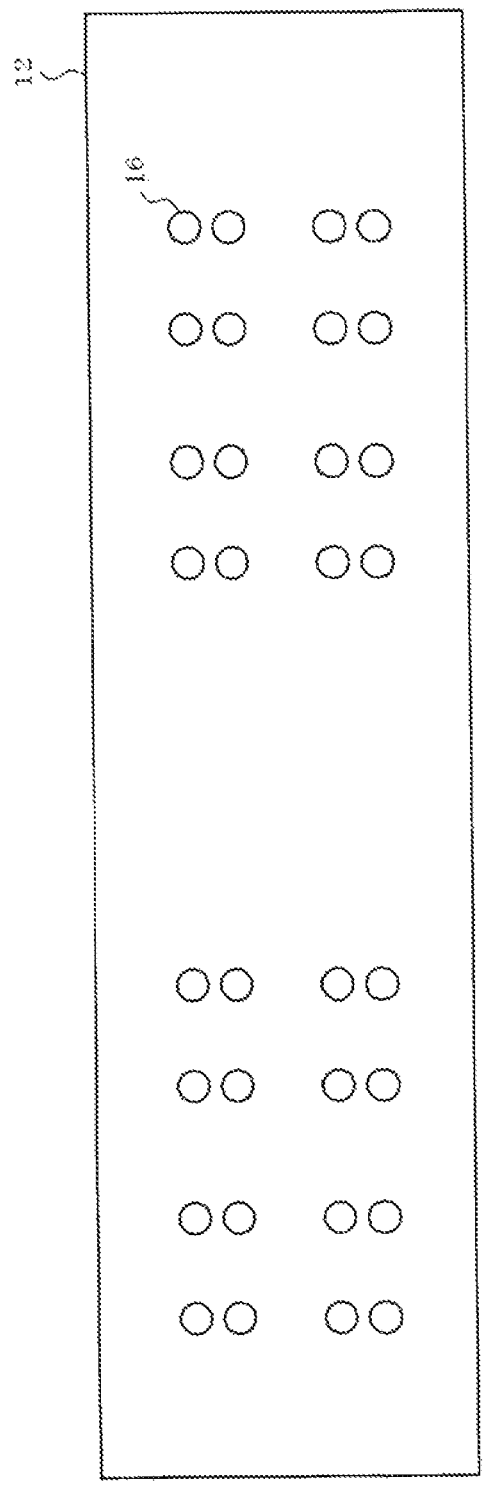
Figure 12:
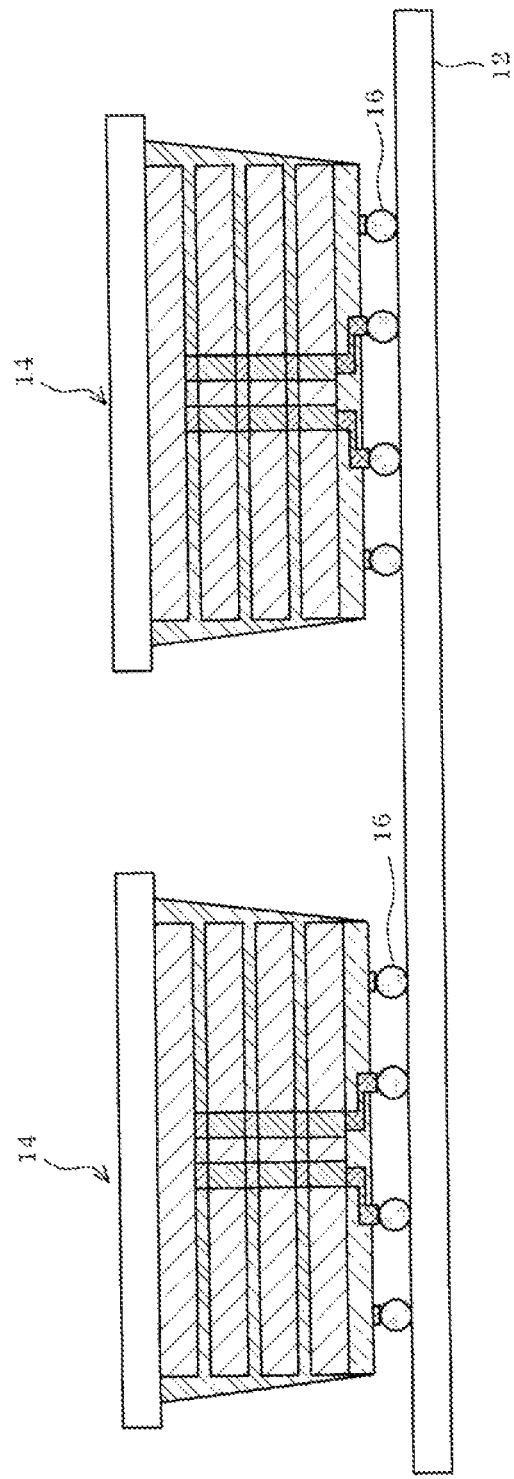
FIG. 12 is a sectional view of a state in which the stacked bodies are mounted on the substrate.
Figure 13:
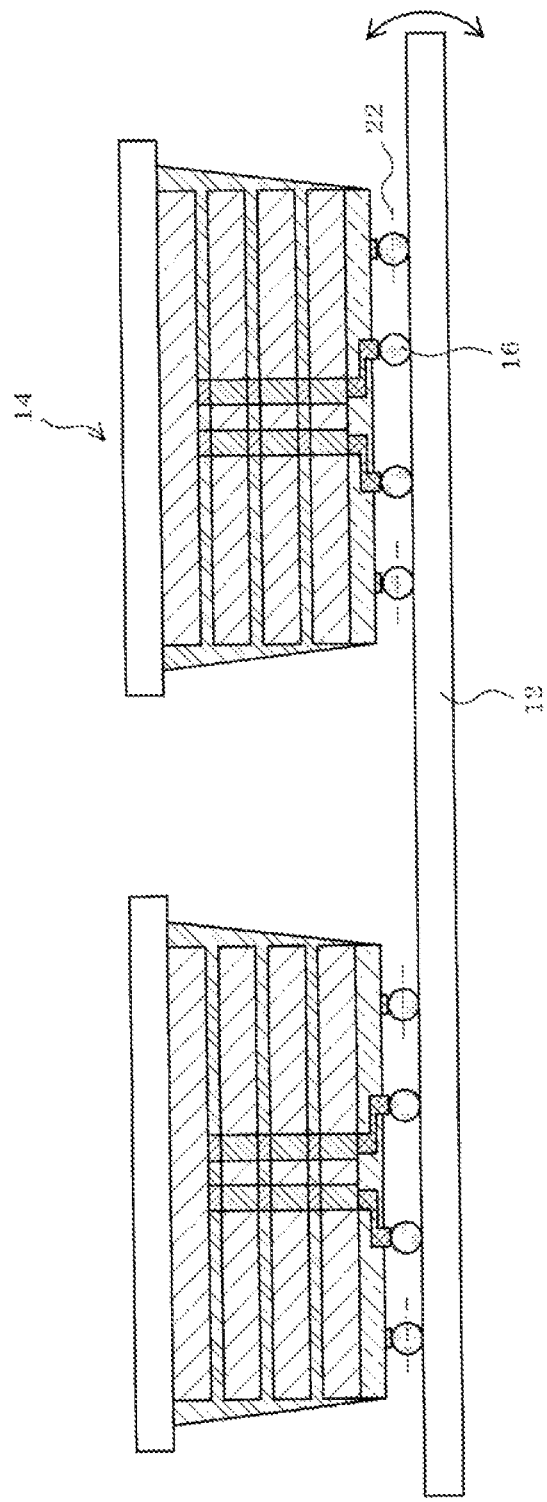
FIG. 13 is a sectional view of a state in which a crack appears in a solder joint.

Here, a problem which will arise when the adhesive material 18 is not used as it is in this embodiment will be described with reference to FIGS. 11A to 13. FIGS. 11A and 11B are diagrams corresponding to FIG. 6, and only the solder bumps 16 are placed on the substrate 12. If the stacked bodies 14 are mounted on the substrate 12 in this state as depicted in FIG. 12 and soldering is performed by heating the solder bumps 16, the substrate 12 becomes deformed due to thermal contraction after joining as indicated by an arrow in FIG. 13. This deformation may produce a crack 22 in a solder joint. In the embodiment, since the four corners of the stacked body 14 are fixed to the substrate 12 with the adhesive material 18, the deformation of the substrate 12 and the resultant occurrence of the crack 22 as depicted in FIG. 13 is suppressed.

As described above, according to the embodiment, on the semiconductor chip 2 having the metal electrode pad 3 on an upper surface thereof, the semiconductor chip 4 having the through via 6 and the metal electrode pad 7 is mounted with the electrode pads 3 and 7D being brought into alignment with each other. Next, on the semiconductor chip 4, the semiconductor chip 5 having the through via 8 and, on an upper surface thereof, the rewiring section 11 formed within the protective film 10 and metal electrode pads 13 connected to the rewiring section 11 and exposed at openings in the protective film 10 is mounted with the electrode pads 7U and 9 being brought into alignment with each other. Then, by joining the electrode pads 3, 7, and 9 to one another, the semiconductor chips 2, 4, and 5 are electrically connected to one another, whereby the stacked body 14 is formed, and the gaps of the stacked body 14 are filled with the UF resin 15.

On an upper surface side of the substrate 12, the solder bumps 16 are formed and the adhesive material 18 is placed by being applied thereto. To mount a plurality of stacked bodies 14 on the substrate 12, each solder bump 16 on the substrate 12 and the metal electrode pad 13 on the upper surface of the semiconductor chip 5 of each stacked body 14 are joined to each other after being brought into alignment with each other, and the plurality of stacked bodies 14 are secured with the adhesive material 18. Then, the stacked bodies 14 and the substrate 12 are encapsulated in the molding resin 19, and package dicing is performed to obtain separate stacked bodies 14, whereby the semiconductor device 21 is obtained.

That is, by fixing the stacked body 14 to the substrate 12 with the adhesive material 18, it is possible to suppress the deformation of the substrate 12 when the stacked body 14 and the substrate 12 are joined to each other with the solder bumps 16 and thereby suppress the occurrence of cracks 22 in the solder joints. In this case, a plurality of solder bumps 16 are formed on the substrate 12 so that the outside shape of the region of the solder bumps 16 forms the rectangular perimeter region 17, and the adhesive materials 18A to 18D are placed on the outer sides of the four corners of the rectangular perimeter region. As a result, since the four corners of the stacked body 14 are fixed to the substrate 12 with the adhesive material 18, it is possible to suppress the deformation of the substrate 12 satisfactorily.

(Second Embodiment)

Figure 14:
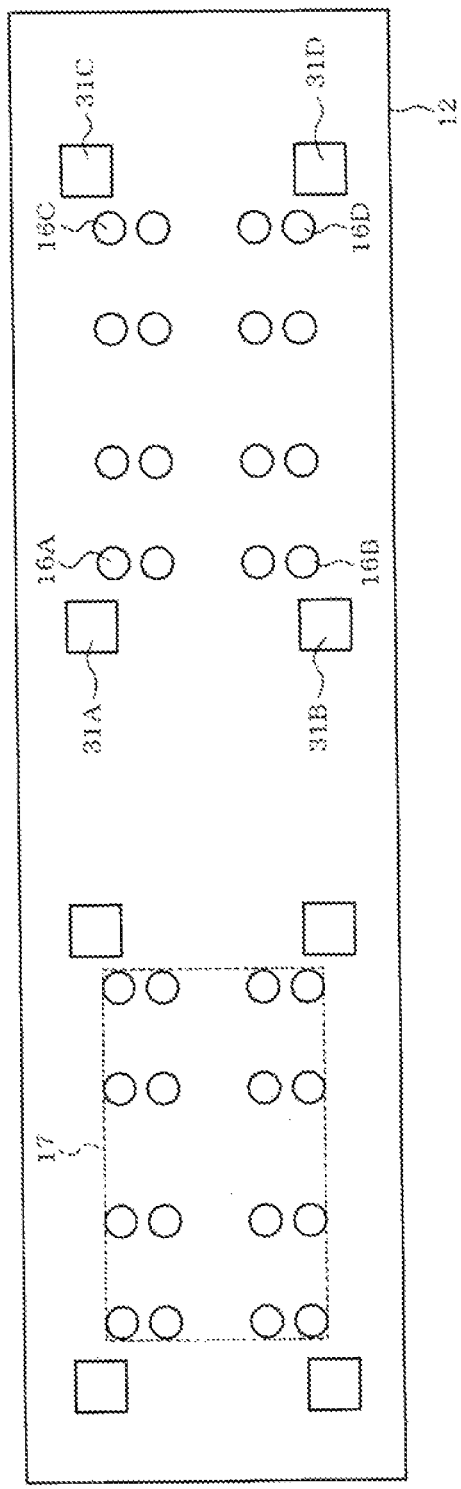
FIG. 14 is a diagram depicting a second embodiment and corresponding to FIG. 6.
Figure 15:
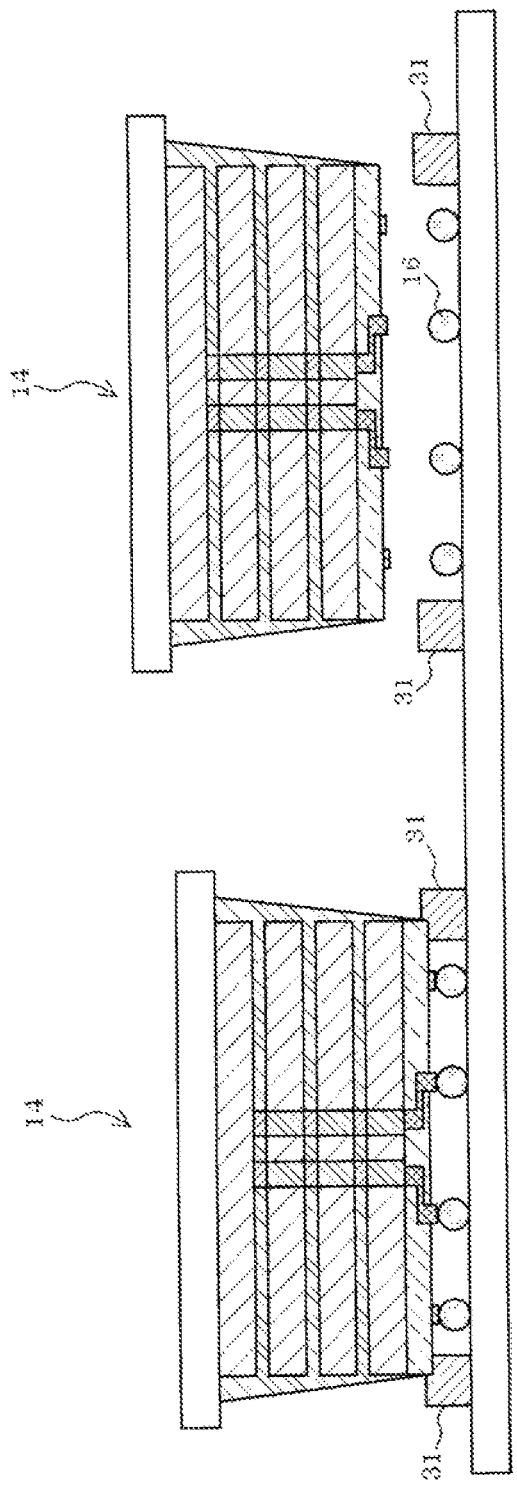
FIG. 15 is a diagram depicting the second embodiment and corresponding to FIG. 7.

FIGS. 14 and 15 depict a second embodiment, and such portions as are found also in the first embodiment are identified with the same characters and the descriptions thereof will be omitted; hereinafter, only difference from the first embodiment will be described. In the second embodiment, as depicted in FIG. 14, in place of the adhesive material 18, an adhesive material sheet 31 is used. That is, in place of the adhesive materials 18A to 18D, adhesive material sheets 31A to 31D are placed so as to be respectively located near the solder bumps 16A to 16D corresponding to the four corners of the placement region 17. Moreover, as depicted in FIG. 15 which is a diagram corresponding to FIG. 7, the adhesive material sheets 31A to 31D are placed to be in contact with the four corners of the semiconductor chip 5 on the stacked body 14 side. A subsequent process is the same as the process according to the first embodiment.

As described above, according to the second embodiment, since the four corners of the stacked body 14 are fixed to the substrate 12 by using the adhesive material sheet 31 in place of the adhesive material 18 according to the first embodiment, it is possible to produce the same advantage as the advantage of the first embodiment.

(Third Embodiment)

Figure 16:
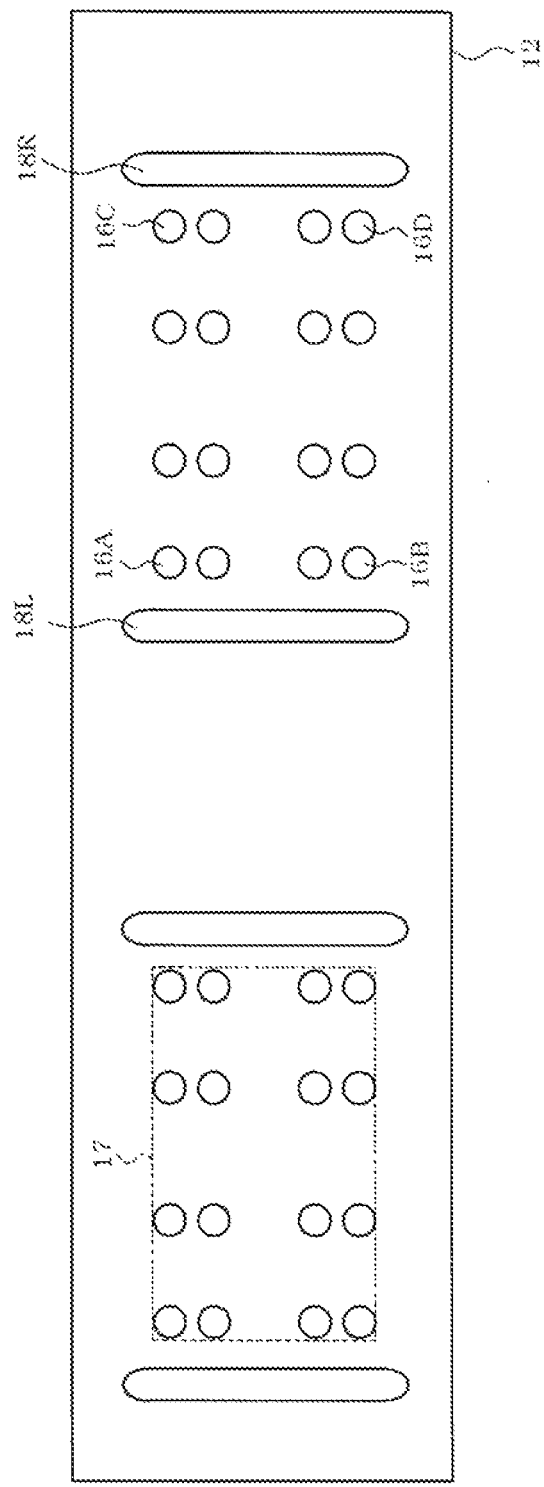
FIG. 16 is a diagram depicting a third embodiment and corresponding to FIG. 6.

In a third embodiment depicted in FIG. 16, the adhesive material 18 is placed, as adhesive materials 18L and 18R, each forming a straight line, on the left side of one side (a shorter side) of the rectangular placement region 17 in which the solder bumps 16 are placed, the one side formed by the solder bumps 16A and 16B, and on the right side of one side of the region, the one side formed by the solder bumps 16C and 16D. In addition, these adhesive materials 18L and 18R are placed to be in contact with the corresponding two sides of the semiconductor chip 5 on the stacked body 14 side.

Also in the third embodiment as described above, it is possible to produce the same advantage as the advantage of each embodiment. Incidentally, the adhesive material 18 forming a straight line may be placed on the upper side of one side (a longer side) of the placement region 17, the one side formed by the solder bumps 16A and 16C, and on the lower (opposite) side of one side of the placement region 17, the one side formed by the solder bumps 16B and 16D. Moreover, the adhesive material sheet 31 used in the second embodiment may be placed linearly in a similar manner.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The semiconductor chip may be formed of a material other than silicon.

The number of stacked intermediate semiconductor chips 4 is not limited to three and may be appropriately changed in accordance with individual designs. Moreover, only one intermediate semiconductor chip 4 may be used.

The metal substrate 1 may be used if necessary.

The state of placement of the adhesive material may be changed as appropriate as long as the deformation of the substrate may be prevented.

What is claimed is:

1. A method for manufacturing a semiconductor device, the method comprising:
   mounting at least one second semiconductor chip having a first through via and a second electrode pad joined to the first through via onto a first semiconductor chip having a first electrode pad on a first surface thereof, the second electrode pad and the first electrode pad being brought into alignment with one another;
   mounting a third semiconductor chip on the second semiconductor chip, the third semiconductor chip having a second through via, and on one surface thereof, a third electrode pad joined to the second through via and, on another surface thereof, a fourth electrode pad and a protective film having wiring therein, the fourth electrode pad formed so as to be joined to the wiring, the second electrode pad of the second semiconductor chip and the third electrode pad of the third semiconductor chip positioned in alignment with one another;
   joining the first to third electrode pads to one another and thereby electrically connecting the first semiconductor chip, the second semiconductor chip, and the third semiconductor chip to one another;
   filling gaps in a stacked body formed of the first semiconductor chip, the second semiconductor chip, and the third semiconductor chip with resin;
   providing a substrate having at least one surface on which solder bumps are formed in a pattern and having a perimeter surrounding the solder bumps;
   providing an adhesive material adjacent to, but outside of the perimeter surrounding, the solder bumps on the substrate;
   joining each solder bump on the substrate and the fourth electrode pad of the stacked body to each other while bringing each solder bump and the fourth electrode pad into alignment with each other and firmly fixing the stacked body to the substrate with the adhesive material;
   encapsulating the stacked body and the surface of the substrate with molding resin; and
   dicing the substrate and the molding resin to separate the stacked body from one or more other stacked bodies.

2. The method according to claim 1, wherein
   the solder bumps are formed on the substrate so that a perimeter of a plurality of solder bumps on the substrate forms a rectangular region, and
   the adhesive material is placed on an outer side of each of the four corners of the rectangular region.

3. The method according to claim 2, wherein the adhesive material is placed on an extension of a diagonal extending between opposed corners of the perimeter of the rectangular region.

4. The method according to claim 1, wherein
   the solder bumps are formed on the substrate so that a perimeter of a plurality of solder bumps on the substrate forms a rectangular region, and
   the adhesive material is placed on an outer side of each of facing two sides of the perimeter of the rectangular region in the form of a straight line.

5. The method according to claim 1, wherein
   the adhesive material is an adhesive material sheet.

6. The method according to claim 1, wherein the electrode pads of the facing surfaces of at least the first and second substrates are joined to one another by thermocompression bonding prior to filling gaps of a stacked body formed of the first semiconductor chip, the second semiconductor chip, and the third semiconductor chip with resin.

7. The method according to claim 1, further comprising attaching a second surface of the first semiconductor chip, opposed to the first surface of the first semiconductor chip, to a metal substrate prior to aligning the second electrode pad of the second semiconductor substrate to the first electrode pad of the first semiconductor substrate.

8. The method according to claim 1, further comprising maintaining a gap between the substrate and the stacked body in the region between the adhesive material locations.

9. The method according to claim 1, wherein the adhesive material is compressible upon heating thereof.

10. A method of manufacturing a semiconductor device, comprising:
    providing a stacked body of one or more semiconductor chips interconnected together through vias extending through at least a portion thereof and terminating in electrode pads;
    providing, at one surface of the stacked body, a rewiring portion terminating in a plurality of metal electrode pads exposed at the one surface of the stacked body, the metal electrodes connected, via the rewiring portion, to the electrode pads of at least one semiconductor chip in the stacked body;
    providing a substrate having a plurality of solder bumps on a first side thereof, the solder bumps distributed on the substrate in the same pattern as the electrode pads of the rewiring layer;
    aligning the electrode pads with the solder bumps, and positioning an adhesive on one of the substrate or the stacked body and between the stacked body and the substrate in an area outside of a perimeter within which the solder bumps are positioned on the substrate; and
    positioning the electrode pads in contact with the solder bumps and heating the solder bumps to a flow temperature and allowing the solder bumps to cool to bond the electrode pads to the solder bumps, while simultaneously bonding the stacked body to the substrate with the adhesive.

11. The method of claim 10, wherein the perimeter around the solder bumps is rectangular.

12. The method of claim 11, wherein the adhesive extends in a line along opposed sides of the rectangular perimeter.

13. The method of claim 11, wherein the adhesive is located adjacent to each corner of the rectangular perimeter.

* * * * *